(12) United States Patent
Sawada

(10) Patent No.: US 10,291,144 B2
(45) Date of Patent: May 14, 2019

(54) INTELLIGENT POWER MODULE, ELECTRIC VEHICLE, AND HYBRID CAR

(71) Applicant: ROHM CO., LTD., Kyoto (JP)

(72) Inventor: Hideki Sawada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 120 days.

(21) Appl. No.: 15/361,244

(22) Filed: Nov. 25, 2016

(65) Prior Publication Data

US 2017/0162466 A1 Jun. 8, 2017

(30) Foreign Application Priority Data

Dec. 3, 2015 (JP) ................................. 2015-236365

(51) Int. Cl.
| | |
|---|---|
| B60L 11/18 | (2006.01) |
| H01L 23/367 | (2006.01) |
| H02P 27/06 | (2006.01) |
| H02M 7/00 | (2006.01) |
| H05K 7/20 | (2006.01) |
| H01L 25/11 | (2006.01) |
| H02M 7/5387 | (2007.01) |
| H02M 1/32 | (2007.01) |
| H01L 23/34 | (2006.01) |

(52) U.S. Cl.
CPC ......... *H02M 7/003* (2013.01); *B60L 11/1803* (2013.01); *H01L 25/115* (2013.01); *H05K 7/209* (2013.01); *H01L 23/34* (2013.01); *H01L 23/367* (2013.01); *H02M 7/5387* (2013.01); *H02M 2001/327* (2013.01); *H02P 27/06* (2013.01)

(58) Field of Classification Search
CPC .... B60L 11/1803; H01L 23/34; H01L 23/367; H01L 23/3675; H01L 23/427; H01L 23/46; H01L 23/473; H01L 25/105; H01L 2225/1094; H02M 2001/327; H02P 27/06; H03K 17/567; H03K 17/687; H05K 7/1432; H05K 7/209; H05K 7/2089; H05K 7/20927

See application file for complete search history.

(56) References Cited

U.S. PATENT DOCUMENTS

| | | | | |
|---|---|---|---|---|
| 5,497,289 | A * | 3/1996 | Sugishima | ............ H02M 7/003 318/558 |
| 9,859,810 | B2 * | 1/2018 | Yokoyama | ............ H02M 7/003 |
| 9,881,019 | B2 * | 1/2018 | Matsuo | ............ G06F 17/30174 |
| 2008/0049476 | A1 * | 2/2008 | Azuma | ..................... B60L 3/12 363/131 |

(Continued)

FOREIGN PATENT DOCUMENTS

| | | |
|---|---|---|
| JP | 2009-177038 | 8/2009 |
| JP | 2013-046004 | 3/2013 |
| JP | 2014-183058 | 9/2014 |

*Primary Examiner* — Levi Gannon
(74) *Attorney, Agent, or Firm* — Hamre, Schumann, Mueller & Larson, P.C.

(57) ABSTRACT

An intelligent power module includes at least one power semiconductor module including a semiconductor device, and a sealing body sealing an outer periphery of the semiconductor device, a driving circuit part mounted on the sealing body and configured to drive the power semiconductor module, and a cooling part on which the sealing body is mounted, and configured to cool the power semiconductor module.

17 Claims, 19 Drawing Sheets

(56) References Cited

U.S. PATENT DOCUMENTS

| | | | | |
|---|---|---|---|---|
| 2008/0079021 A1* | 4/2008 | Bayerer | ............... | H01L 23/373 |
| | | | | 257/177 |
| 2008/0198548 A1* | 8/2008 | Nakamura | ......... | H05K 7/20927 |
| | | | | 361/689 |
| 2009/0002956 A1* | 1/2009 | Suwa | ..................... | B60L 1/003 |
| | | | | 361/728 |
| 2010/0259098 A1* | 10/2010 | Huang | ................... | H02M 1/10 |
| | | | | 307/9.1 |
| 2012/0218716 A1* | 8/2012 | Asakura | ............. | H01L 23/4006 |
| | | | | 361/717 |

* cited by examiner

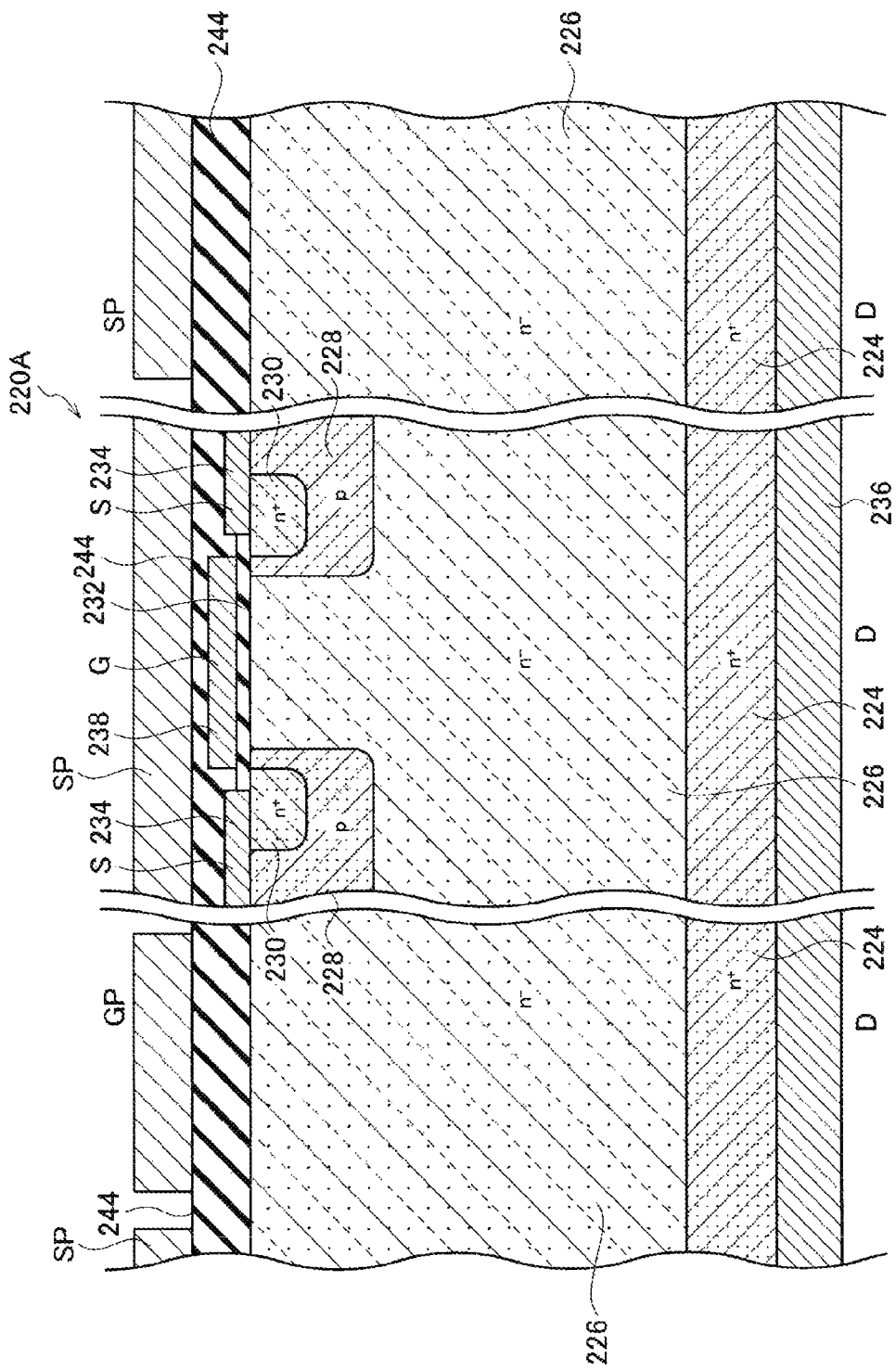

INTELLIGENT POWER MODULE, ELECTRIC VEHICLE, AND HYBRID CAR

CROSS-REFERENCE TO RELATED APPLICATION

This application is based upon and claims the benefit of priority from Japanese Patent Application No. 2015-236365, filed on Dec. 3, 2015, the entire contents of which are incorporated herein by reference.

TECHNICAL FIELD

The present disclosure relates to an intelligent power module, and an electric vehicle or a hybrid car.

BACKGROUND

A power semiconductor module in which an outer periphery of a power device (chip) including a semiconductor device such as an insulated gate bipolar mode transistor (IGBT) is molded with a resin is known as one type of semiconductor module. In an operational state, since the semiconductor device generates heat, a heat dissipating device such as a heat sink or fins is generally disposed on its rear side to cool the semiconductor device.

Further, in order to increase a heat dissipation effect, a power semiconductor module having a cooler to perform cooling using a coolant has is known.

SUMMARY

The present disclosure provides some embodiments of an intelligent power module, and an electric vehicle or a hybrid car, having improved heat dissipation properties, being easily modularized, and being suitably miniaturized.

According to one embodiment of the present disclosure, there is provided an intelligent power module, including: at least one power semiconductor module including a semiconductor device, and a sealing body sealing an outer periphery of the semiconductor device; a driving circuit part mounted on the sealing body and configured to drive the power semiconductor module; and a cooling part on which the sealing body is mounted, and configured to cool the power semiconductor module.

According to another embodiment of the present disclosure, there is provided an intelligent power module, including: a plurality of power semiconductor modules, each of the plurality of power semiconductor modules including a semiconductor device, and a sealing body sealing an outer periphery of the semiconductor device; a driving circuit part mounted on the sealing body and configured to drive the power semiconductor module; and a cooling part on which the sealing body is mounted, and configured to cool the power semiconductor module, wherein the plurality of power semiconductor modules is disposed to constitute a two-in-one module, and wherein the plurality of power semiconductor modules constitutes a six-in-one module type inverter or a six-in-one module type converter.

According to still another embodiment of the present disclosure, there is provided an electric vehicle or a hybrid car having the intelligent power module mounted thereon.

BRIEF DESCRIPTION OF THE DRAWINGS

FIGS. 2A and 2B are views illustrating some parts of the configuration of the intelligent power module according to the first embodiment, in which FIG. 2A is a schematic cross-sectional view taken along line Ia-Ia of FIG. 1 and FIG. 2B is a schematic cross-sectional view taken along line Ib-Ib of FIG. 1.

FIGS. 3A to 3C are views illustrating some parts of the configuration of the intelligent power module according to the first embodiment, in which FIG. 3A is a schematic cross-sectional view taken along line Ic-Ic of FIG. 1, FIG. 3B is a schematic cross-sectional view taken along line Id-Id of FIG. 1, and FIG. 3C is a schematic cross-sectional view taken along line Ie-Ie of FIG. 1.

FIGS. 7A and 7B are views illustrating configuration examples of the driving circuit part that is applicable to the power semiconductor module of the intelligent power module according to the first embodiment, in which FIG. 7A is a schematic view illustrating a configuration of a planar pattern on a front surface and FIG. 7B is a schematic view illustrating a configuration of a projected planar pattern of a rear surface.

FIGS. 10A and 10B are views illustrating examples of the power semiconductor module that is applicable to the intelligent power module according to the first embodiment, in which FIG. 10A is a circuit diagram of an SiC MOSFET of a two-in-one module and FIG. 10B is a circuit diagram of an IGBT of a two-in-one module.

FIGS. 11A and 11B are views illustrating examples of the power semiconductor module that is applicable to the intelligent power module according to the first embodiment, in which FIG. 11A is a schematic cross-sectional view of an SiC MOSFET and FIG. 11B is a schematic cross-sectional view of an IGBT.

FIG. 12 is a view illustrating an example of the power semiconductor module that is applicable to the intelligent power module according to the first embodiment, which is specifically a schematic cross-sectional view of an SiC MOSFET including a source pad electrode SP and a gate pad electrode GP.

FIGS. 16A and 16B are views illustrating examples of a circuit configuration of the 3-phase AC inverter formed using the intelligent power module according to the first embodiment, in which FIG. 16A illustrates an example of a circuit configuration in which a snubber condenser is connected between a power terminal PL and a ground terminal NL employing an SiC MOSFET and FIG. 16B illustrates an example of a circuit configuration in which a snubber condenser is connected between a power terminal PL and a ground terminal NL employing an IGBT.

DETAILED DESCRIPTION

Figure 1:
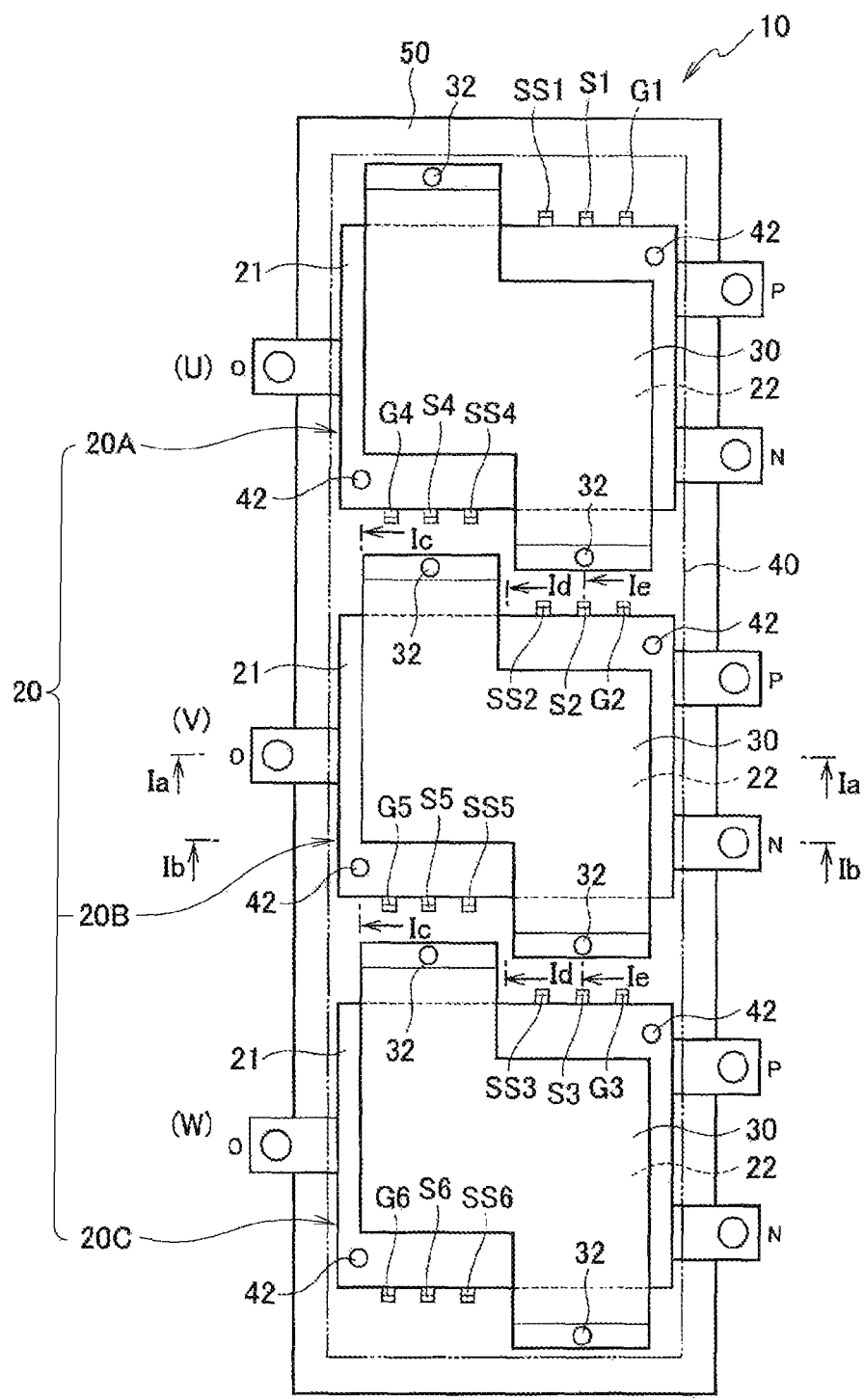
FIG. 1 is a plane view illustrating a schematic configuration of an intelligent power module according to a first embodiment of the present disclosure.

Embodiments of the present disclosure will now be described with reference to the drawings. In the following description of the drawings, like or similar reference numerals are used for like or similar parts. However, it should be noted that the plane views, side views, bottom views, and cross-sectional views are schematic, and the relationships between thicknesses and planar dimensions of respective components, and the like are different from those of reality. Thus, specific thicknesses or dimensions should be determined in consideration of the following description. Also, it is understood that parts having different dimensional relationships or ratios are included among the drawings.

Further, the embodiments described below are presented to illustrate apparatuses or methods for embodying the technical concept of the present disclosure and are not intended to specify the materials, features, structures, arrangements, and the like of the components to those shown below. The embodiments may be various modified within the scope of claims.

First Embodiment (Overall Configuration)

A planar structure of an intelligent power module (IPM) 10 according to a first embodiment of the present disclosure is illustrated in FIG. 1. Further, in FIG. 1, a part (driving circuit part 40 and the like) of the IPM 10 is illustrated to be penetrated.

As illustrated in FIG. 1, the IPM 10 includes a heat sink (which may be a cooler such as a heat sink or a water jacket (WJ) made of, for example, aluminum (Al)) 50, a plurality of power semiconductor modules 20 (20A, 20B, and 20C) mounted on the heat sink 50, and a driving circuit part (for example, FR-4 and 6 layers) 40 that is commonly mounted on the power semiconductor modules 20A, 20B, and 20C.

Figure 3A:
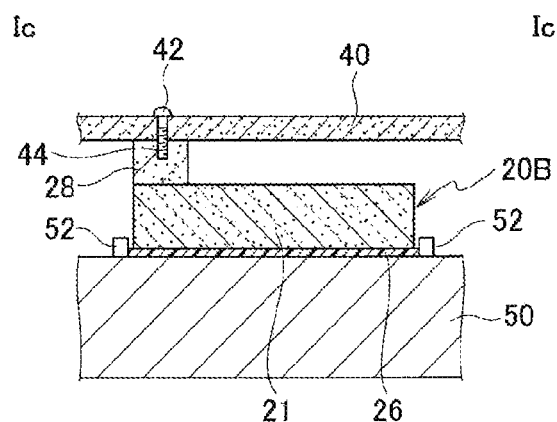
Figure 3B:
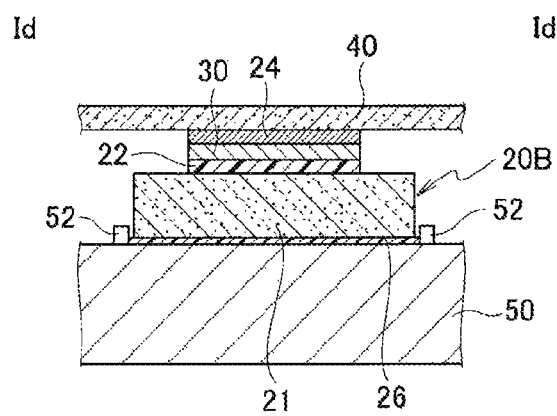
Figure 3C:
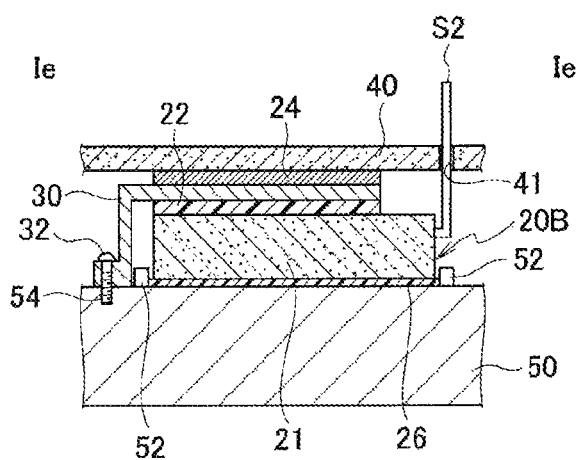
Figure 4:
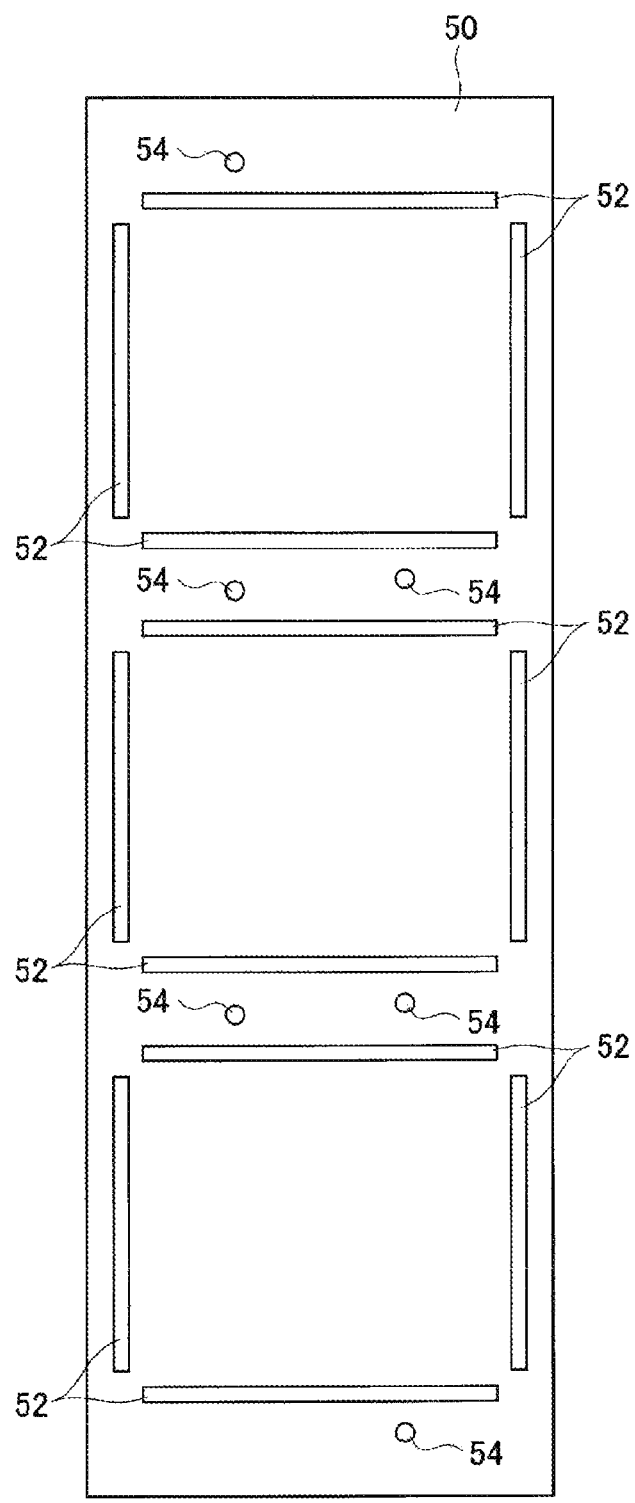
FIG. 4 is a plane view illustrating a schematic configuration of a heat dissipation plate that is applicable to the intelligent power module according to the first embodiment.

Mounting positions of the power semiconductor modules 20A, 20B, and 20C are defined in advance by positioning convex portions 52 disposed on an upper surface (mounting surface) of the heat sink 50 (see FIGS. 2 to 4).

The IPM 10 according to the first embodiment may constitute, for example, a six-in-one (6 in 1) type switching module by employing a two-in-one (2 in 1) type in the power semiconductor modules 20A, 20B, and 20C, details of which will be described later. In the IPM 10 constituting the switching module, the power semiconductor modules 20A, 20B, and 20C may be effectively cooled to suppress degradation due to overheating.

Here, although not shown, the IPM 10 according to the first embodiment may be configured by the heat sink 50, a power semiconductor module 20 mounted on the heat sink 50, and a driving circuit part 40 mounted on the power semiconductor module 20.

That is to say, the IPM 10 according to the first embodiment may include at least one power semiconductor module 20 having a package (sealing body) 21 that seals an outer periphery of a semiconductor device (not shown), a driving circuit part 40 that is disposed on the package 21 and drives the power semiconductor module 20, and a heat sink (cooling part) 50 on which the package 21 is mounted and which dissipates heat generated by the power semiconductor module 20. In this configuration, the IPM 10 according to the first embodiment has excellent heat dissipation properties, and can be easily modularized and suitably miniaturized.

In the IPM 10 according to the first embodiment, schematic cross-sectional structures of the power semiconductor modules 20A, 20B, and 20C are illustrated in FIGS. 2A, 2B, and 3A to 3C. Further, since the power semiconductor modules 20A, 20B, and 20C have the same structure, the power semiconductor module 20B will be described herein as an example.

Figure 2A:
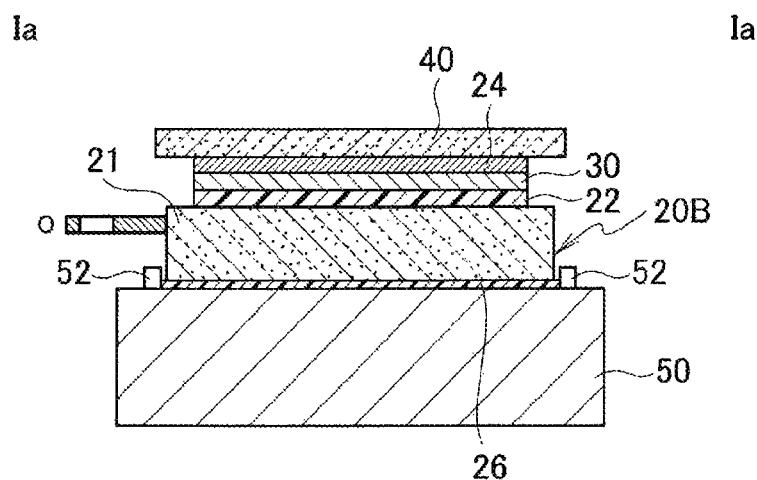
Figure 2B:
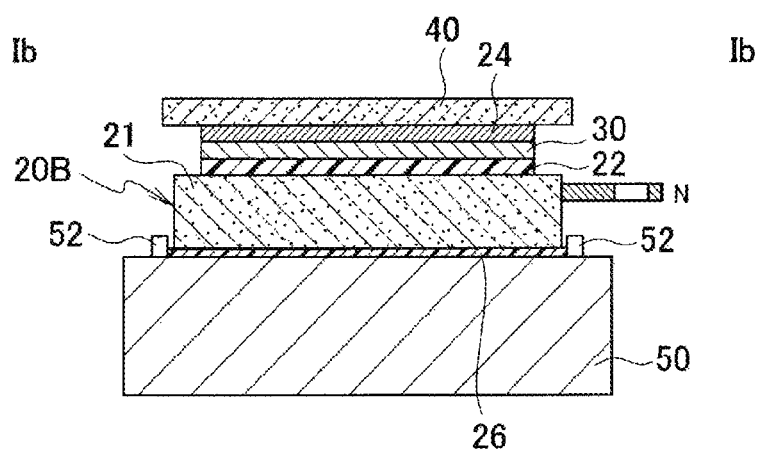

That is to say, FIG. 2A is a schematic cross-sectional view of the IPM 10, taken along line 1a-1A of FIG. 1, FIG. 2B is a schematic cross-sectional view of the IPM 10, taken along line Ib-Ib of FIG. 1, FIG. 3A is a schematic cross-sectional view of the IPM 10, taken along line Ic-Ic of FIG. 1, FIG. 3B is a schematic cross-sectional view of the IPM 10, taken along line Id-Id of FIG. 1, and FIG. 3C is a schematic cross-sectional view of the IPM 10, taken along line Ie-Ie of FIG. 1, in which the package 21 of the power semiconductor module 20B is bonded within a range defined by the convex portions 52 on an upper surface of the heat sink 50 through a bonding material 26.

As the bonding material 26, for example, an adhesive such as a heat compound or silver (Ag) paste, or the like may be used. In particular, the bonding material 26 preferably has heat conductivity of 0.5 W/mk to 300 W/mk, and one organic material such as, for example, an epoxy resin, an acryl resin, a silicon resin, a urethane resin, and polyimide may be used as a single body. Further, the bonding material 26 may be a synthetic resin obtained by mixing one of the organic materials with metal powder or various ceramic powders. Alternatively, various solders or sintered silver (Ag), or the like may be heated and cured so as to be used as the bonding material 26.

A heat dissipation plate 30 made of metal (for example, copper (Cu) or aluminum (Al)) is bonded to an upper surface of the power semiconductor module 20B through a heat dissipation resin 22 such as grease or a silicon resin having heat dissipation properties. As illustrated in FIGS. 1 and 3C, both end portions of the heat dissipation plate 30 are screw-fixed to an upper surface of the heat sink 50 by a screw 32 formed of a metal or a resin. The power semiconductor module 20B is further firmly bonded to the upper surface of the heat sink 50 through fixing of the heat dissipation plate 30.

Further, since the heat dissipation plate 30 and the heat sink 50 are firmly bonded, high heat dissipation properties of the power semiconductor module 20B and the driving circuit part 40 are secured. In other words, a partial amount of heat generated by the power semiconductor module 20B and the driving circuit part 40 is absorbed by the heat dissipation plate 30 and then dissipated by the heat sink 50.

Further, when the heat dissipation plate 30 is fixed by the screw 32, both end portions of the heat dissipation plate 30 may be bonded to the upper surface of the heat sink 50 by, for example, the bonding material 26 or the like.

The driving circuit part 40 is bonded onto the heat dissipation plate 30 through a heat dissipation sheet (or a silicon resin having heat dissipation properties or the like) 24 made of a resin material such as alumina (including an inorganic filler) having a thickness of about 2 mm to 5 mm. A lead terminal S2 of the power semiconductor module 20B illustrated in FIG. 3C, which is upwardly bent, is inserted into an insertion hole 41 of the driving circuit part 40, allowing the driving circuit part 40 to be connected to lead terminal (gate signal terminal electrodes G1 to G6, source signal terminal electrodes S1 to S6, and source sense terminals SS1 to SS6).

That is to say, the driving circuit part 40 is formed by packaging a driving circuit board on which a driving circuit for driving the power semiconductor modules 20A, 20B, and 20C is mounted, for example, through a mold resin, and has the insertion hole 41 into which the lead terminal in an upwardly bent state is inserted.

Further, although not shown, the lead terminal inserted into the insertion hole 41 may include a temperature measurement terminal such as, for example, a thermister embedded in the power semiconductor modules 20A, 20B, and 20C.

As illustrated in FIGS. 1 and 3A, the driving circuit part 40 is screw-fixed to an attachment portion 28 on the package 21 by a screw 42 formed of a metal or a resin in, for example, two points of one segment of a diagonal line.

Here, the attachment portion 28 formed of, for example, a mold resin is installed in two points of an upper surface of the package 21 of each of the power semiconductor modules 20A, 20B, and 20C on a diagonal line, and a circuit part mounting hole 44 for fixing the driving circuit part 40 by the screw 42 is formed in the attachment portion 28.

As illustrated in FIG. 4, the heat sink 50 is commonly installed in the power semiconductor modules 20A, 20B, and 20C. The heat sink 50 is connected to, for example, a copper plate layer (not shown) as a heat spreader exposed to a rear surface of the package 21 of each of the power semiconductor modules 20A, 20B, and 20C.

The positioning convex portion 52 is installed in an area of the heat sink 50 on which the power semiconductor modules 20A, 20B, and 20C are mounted. The convex portion 52 is formed to follow each side of the package 21 and is disposed to have a frame shape surrounding the periphery of the package 21.

The convex portion 52 also has an effect of increasing rigidity of the heat sink 50, suppressing distortion of the heat sink 50, and preventing leakage of the bonding material 26 when bonded, as well as positioning the power semiconductor modules 20A, 20B, and 20C.

Further, a mounting hole (plate mounting hole) 54 for screw-fixing both end portions of the heat dissipation plate 30 by the screw 32 is formed in a region outer than the edge of the convex portion 52 of the heat sink 50.

Figure 5:
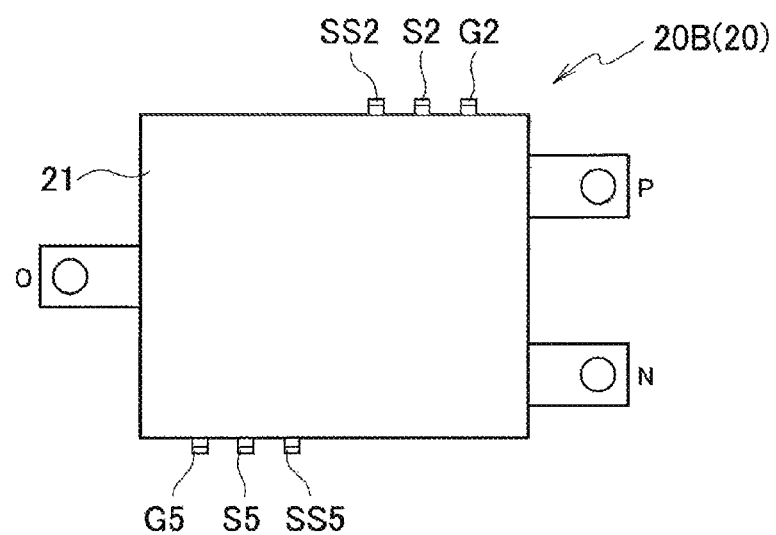
FIG. 5 is a plane view illustrating a schematic configuration of a power semiconductor module that is applicable to the intelligent power module according to the first embodiment.

Here, as illustrated in FIG. 5, the power semiconductor module 20 (20A, 20B, and 20C) that is applied to the IPM 10 according to the first embodiment is a semiconductor package device in which an outer periphery of a power device (semiconductor device) (not shown) is molded in a rectangular shape by the package 21, and here, for example, a 3-terminal type structure having three terminal electrodes P, N, and O, each one, being illustrated.

For example, the power semiconductor module 20B includes a drain terminal electrode P and a ground potential terminal electrode N installed along a first side of the package 21 formed of a mold resin and an output terminal electrode O installed on a third side of the package 21 opposite the first side.

Further, lead terminals G2, S2, and SS2 installed on a second side perpendicular to the first and third sides of the package 21 and lead terminals G5, S5, and SS5 installed on a fourth side of the package 21 extend outwardly from the package 21. In other words, the power semiconductor module 20B is a 2-in-1 type including semiconductor devices Q2 and Q5.

Also, as illustrated in FIG. 1, the power semiconductor module 20A is a 2-in-1 type including semiconductor devices Q1 and Q4, and includes a drain terminal electrode P, a ground potential terminal electrode N, an output terminal electrode O, and lead terminals G1, S1, SS1, G4, S4, and SS4. Similarly, the power semiconductor module 20C is a 2-in-1 type including semiconductor devices Q3 and Q6, and includes a drain terminal electrode P, a ground potential terminal electrode N, an output terminal electrode O, and lead terminals G3, S3, SS3, G6, S6, and SS6.

Further, as described later, the power semiconductor modules 20A, 20B, and 20C are not limited to a configuration in which a semiconductor device has 1 chip, and may also include an electronic component such as a diode or a thermister, in addition to the semiconductor device.

Application Examples

Next, application examples of the IPM 10 according to the first embodiment will be described.

Figure 6:
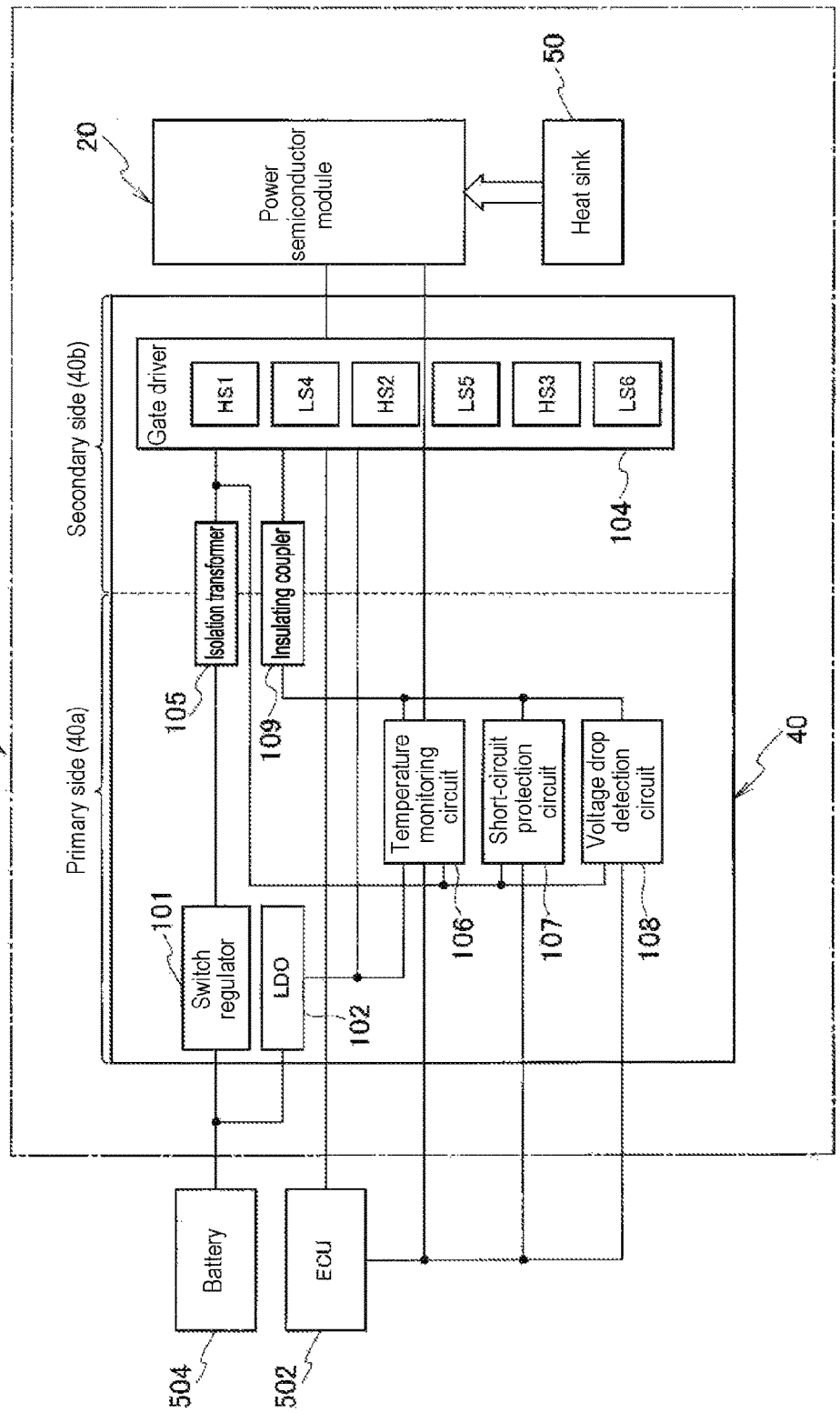
FIG. 6 is a block diagram illustrating a configuration example of a driving circuit part that is applicable to the power semiconductor module of the intelligent power module according to the first embodiment.

FIG. 6 illustrates a case where the IPM 10 according to the first embodiment is installed in, for example, a power control unit of an electric vehicle or a hybrid car. The driving circuit part 40 includes a primary side circuit part 40a and a secondary side circuit part 40b.

A primary coil L1 of an isolation transformer 105 ($105_1$, $105_2$, $105_3$, $105_4$, $105_5$, or $105_6$), a switch regulator 101, a low drop out (LDO) 102, a temperature monitoring circuit 106, a short-circuit protection circuit 107, a voltage drop detection circuit 108, and a light receiving part side of an insulating coupler (photocoupler) 109 ($109_1$, $109_2$, $109_3$, $109_4$, $109_5$, or $109_6$) are installed in the primary side circuit part 40a. The primary coil L1 of the isolation transformer 105 is commonly connected to the switch regulator 101, and the switch regulator 101 and the LDO 102 are connected to, for example, a battery 504 of an electric vehicle or a hybrid car. The temperature monitoring circuit 106, the short-circuit protection circuit 107, and the voltage drop detection circuit 108 are commonly connected to the light receiving part side of the insulating coupler 109.

A secondary coil L2 of the isolation transformer 105, a gate driver 104, and a light emitting part side of the insulating coupler 109 are installed in the secondary side circuit part 40b. The secondary coil L2 of the isolation transformer 105 is commonly connected to the gate driver 104, the temperature monitoring circuit 106, the short-circuit protection circuit 107, and the voltage drop detection circuit 108. The gate driver 104 is connected to the light emitting part side of the insulating coupler 109.

The gate driver 104 and the temperature monitoring circuit 106 are connected between the LDO 102 and the power semiconductor module 20 (20A, 20B, and 20C). Further, the gate driver 104, the temperature monitoring circuit 106, the short-circuit protection circuit 107, and the voltage drop detection circuit 108 are connected to an engine control unit (ECU) 502 of an electric vehicle or a hybrid car.

Further, the gate driver 104 has a plurality of high voltage side drive circuits HS1, HS2, and HS3 and a plurality of low voltage side drive circuits LS4, LS5, and LS6, and a positive and negative power is supplied to the gate driver 104 from a power source circuit as described later.

Figure 7:
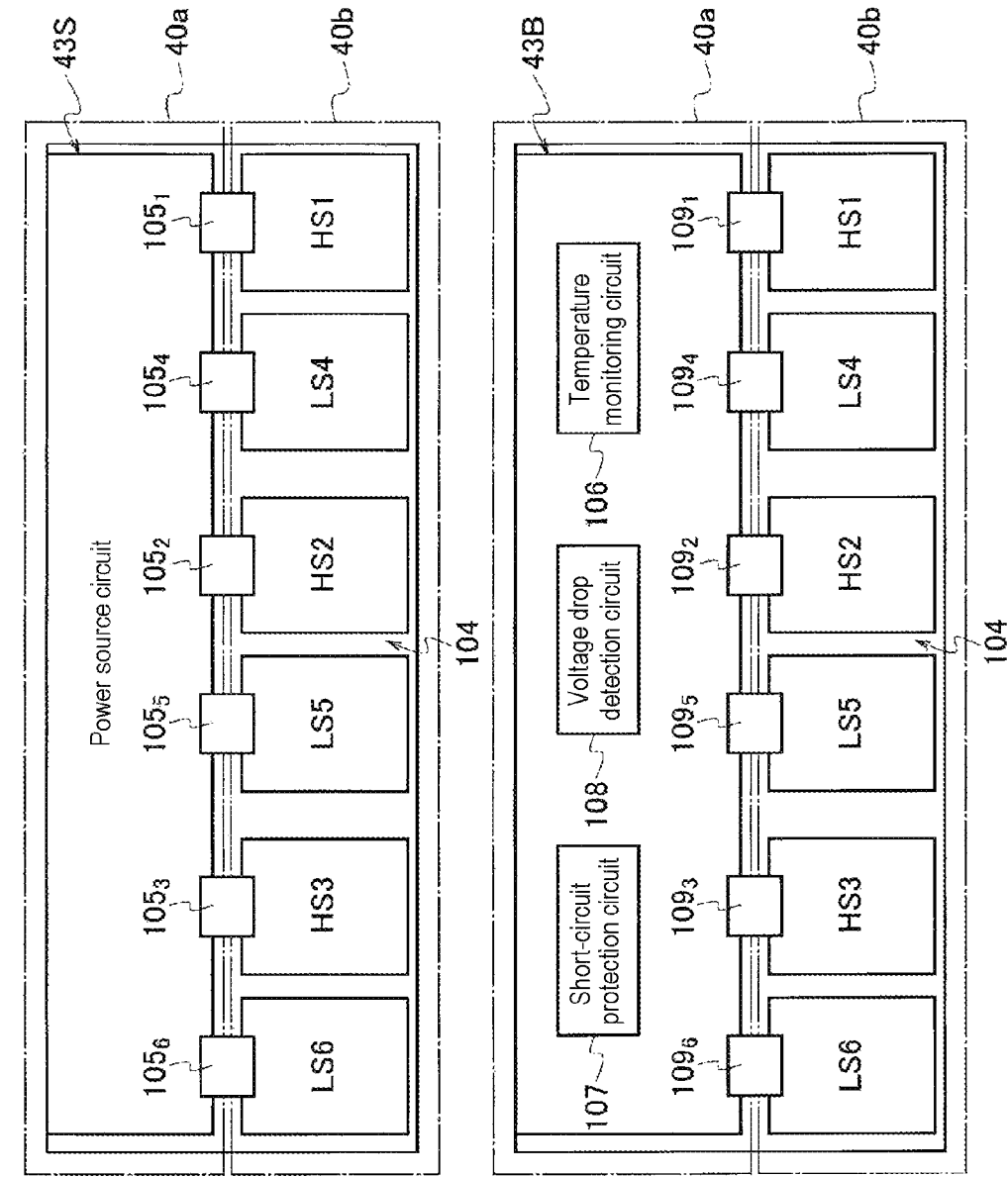

A planar pattern configuration (board configuration) of the driving circuit part 40 having this configuration is illustrated in FIGS. 7A and 7B. Further, FIG. 7A is a schematic view illustrating a configuration of a planar pattern of a front surface (upper surface) 43S of the driving circuit part 40 and FIG. 7B is a schematic view illustrating a configuration of a planar pattern of a rear surface (lower surface) 43B in a state where the configuration of planar pattern of the front surface 43S is projected.

That is to say, the driving circuit part 40 mounted on the power semiconductor modules 20A, 20B, and 20C that are applicable to the IPM 10 according to the first embodiment is commonly installed with respect to the plurality of power semiconductor modules 20A, 20B, and 20C. The driving circuit part 40 has a rectangular shape and includes a primary side circuit part 40a disposed along a length direction and a secondary side circuit part 40b disposed to be adjacent to the primary side circuit part 40a.

A power source circuit including the switch regulator 101 and the LDO 102 described above, and the like are configured by the front surface 43S of the primary side circuit part 40a. The temperature monitoring circuit 106, the short-circuit protection circuit 107, the voltage drop detection circuit 108, and the like are disposed on the rear surface 43B.

The plurality of high voltage side drive circuits HS1, HS2, and HS3 and the plurality of low voltage side drive circuits LS4, LS5, and LS6 of the gate driver 104 are alternately disposed in the secondary side circuit part 40b.

The respective drive circuits HS1, HS2, HS3, LS4, LS5, and LS6 of the secondary side circuit part 40b are commonly connected to a power source circuit of the front surface 43S of the primary side circuit part 40a via the respective isolation transformers $105_1$ to $105_6$ disposed across the primary side circuit part 40a and the secondary side circuit part 40b. Also, the respective drive circuits HS1, HS2, HS3, LS4, LS5, and LS6 are commonly connected to the temperature monitoring circuit 106, the short-circuit protection circuit 107, and the voltage drop detection circuit 108 of the rear surface 43B of the primary side circuit part 40a via the respective insulating couplers $109_1$ to $109_6$ disposed across the primary side circuit part 40a and the secondary side circuit part 40b.

Here, a schematic configuration of a 3-phase AC inverter 10A for driving, for example, a 3-phase AC motor part (not shown) of an electric vehicle or a hybrid car, which is configured by employing the IPM 10 according to the first embodiment will be described. The 3-phase AC inverter 10A is an example of a case where a silicon carbide metal oxide semiconductor field effect transistor (SiC MOSFET) is applied to the semiconductor devices Q1 to Q6.

Figure 8:
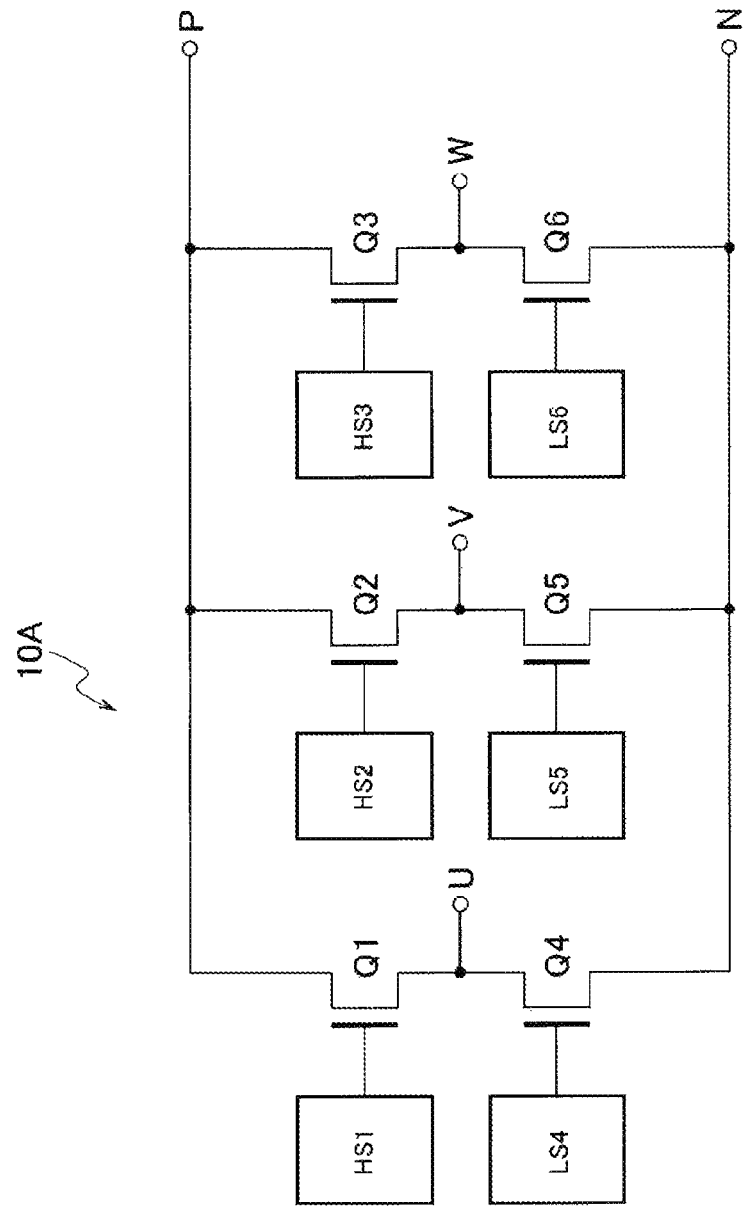
FIG. 8 is a view illustrating a schematic configuration of a 3-phase AC inverter formed using the intelligent power module according to the first embodiment.

As illustrated in FIG. 8, the 3-phase AC inverter 10A corresponds to U, V, and W phases of the 3-phase AC motor part, and a U-phase inverter (SiC MOSFETs Q1 and Q4), a V-phase inverter (SiC MOSFETs Q2 and Q5), and a W-phase inverter (SiC MOSFETs Q3 and Q6) are connected thereto.

The high voltage side drive circuit HS1 is connected to the SiC MOSFET Q1 of the U-phase inverter, and the low voltage side drive circuit LS4 is connected to the SiC MOSFET Q4 of the U-phase inverter. Similarly, the high voltage side drive circuit HS2 is connected to the SiC MOSFET Q2 of the V-phase inverter, and the low voltage side drive circuit LS5 is connected to the SiC MOSFET Q5 of the V-phase inverter. Similarly, the high voltage side drive circuit HS3 is connected to the SiC MOSFET Q3 of the W-phase inverter, and the low voltage side drive circuit LS6 is connected to the SiC MOSFET Q6 of the W-phase inverter.

Figure 9:
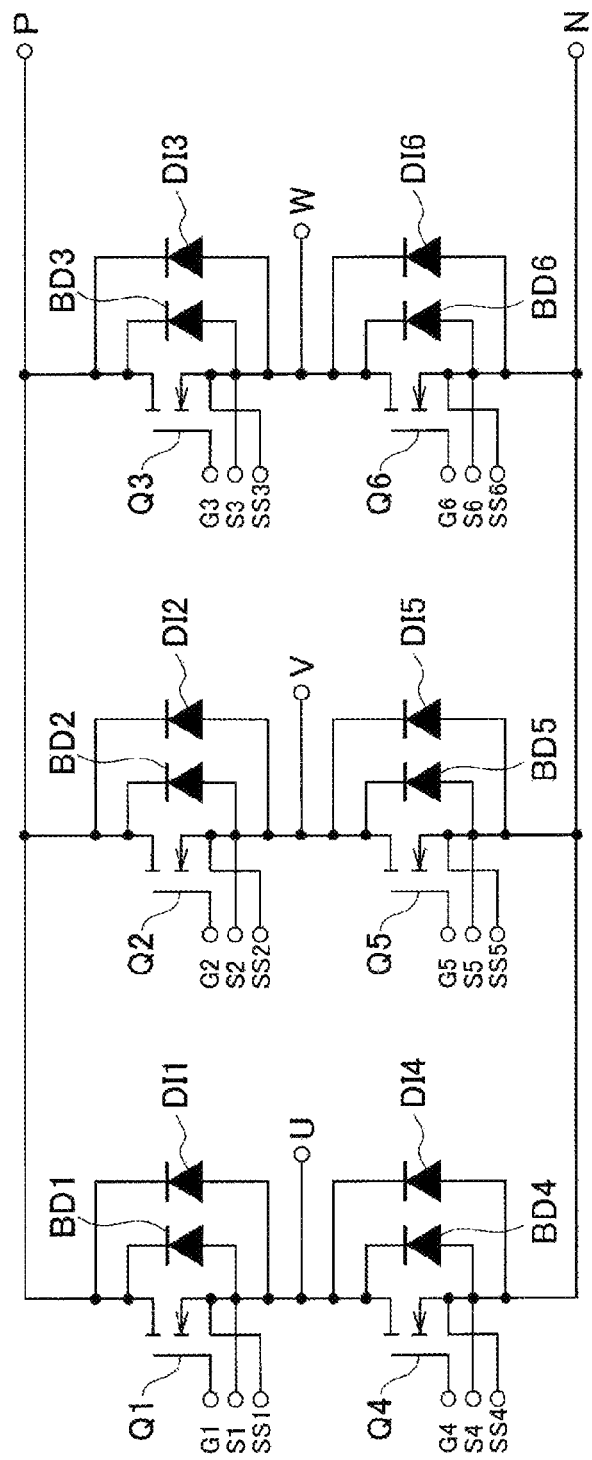
FIG. 9 is a circuit diagram of the 3-phase AC inverter formed using the intelligent power module according to the first embodiment.

The circuit configuration of the 3-phase AC inverter 10A illustrated in FIG. 8 is more specifically illustrated in a 3-phase AC inverter 10B illustrated in FIG. 9, in which SiC MOSFETs Q1 to Q6 have body diodes BD1 to BD6, respectively. Further, free wheel diodes DI1 to DI6 are inverse-parallel connected between the sources and drains of the SiC MOSFETs Q1 to Q6.

Also, instead of the free wheel diodes DI1 to DI6, for example, Schottky barrier diodes may be inverse-parallel connected.

(Circuit Configuration)

Next, a circuit configuration example of the power semiconductor module 20 that is applicable to the IPM 10 according to the first embodiment will be described in more detail.

Here, a semiconductor package device, a so-called 2-in-1 type module, in which two semiconductor devices Q1 and Q4 are molded in one package 21, will be described as the power semiconductor module 20A that is applicable to the IPM 10 according to the first embodiment.

Figure 10A:
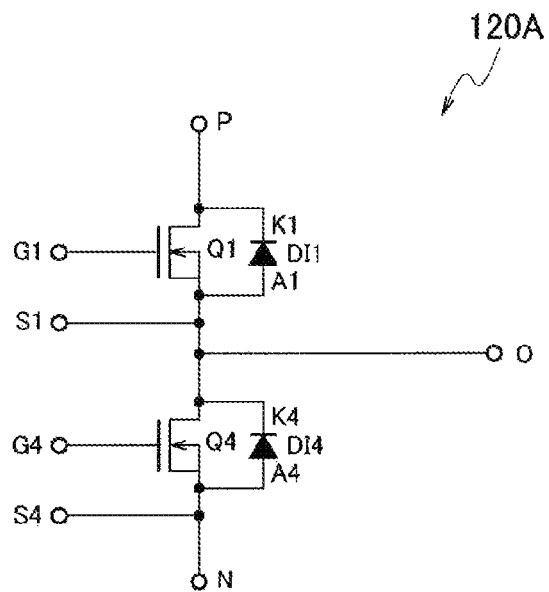

A circuit configuration of a 2-in-1 module 120A to which the SiC MOSFETs are applied as the semiconductor devices Q1 and Q4 is illustrated as an example in FIG. 10A.

That is to say, the 2-in-1 module 120A is a module in which the two SiC MOSFETs Q1 and Q4 are installed as one module, having a half bridge installation module configuration, as illustrated in FIG. 10A.

Here, the module may be considered as one large transistor, but an installed transistor may be one chip or a plurality of chips in some cases. In other words, modules include 1-in-1, 2-in-1, 4-in-1, 6-in-1, and the like, and for example, a module having two transistors (chips) in one module is called 2-in-1, a module having two sets of 2-in-1 is called 4-in-1, and a module having three sets of 2-in-1 is called 6-in-1.

As illustrated in FIG. 10A, in the 2-in-1 module 120A, two SiC MOSFETs Q1 and Q4 and diodes DI1 and DI4 inverse-parallel connected to the SiC MOSFETs Q1 and Q4 are installed as one module. In FIG. 10A, G1 is a gate signal terminal electrode of the SiC MOSFET Q1, and S1 is a source signal terminal electrode of the SiC MOSFET Q1. Similarly, G4 is a gate signal terminal electrode of the SiC MOSFET Q4, and S4 is a source signal terminal electrode of the SiC MOSFET Q4. Further, P is a positive side power input terminal, N is a negative side power input terminal, and O is an output terminal electrode.

Figure 10B:
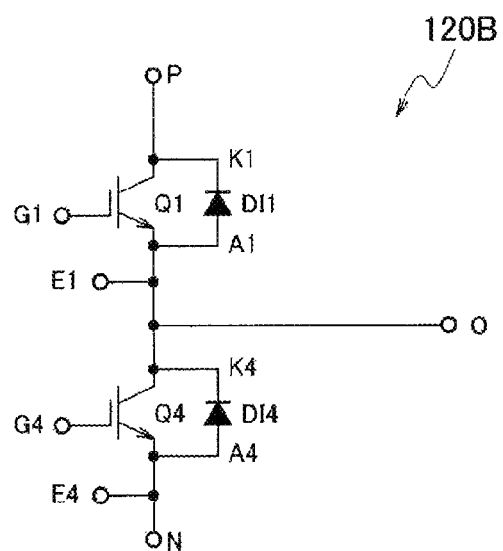

Further, a circuit configuration of a 2-in-1 module 120B that employs insulated gate bipolar transistors (IGBTs) as the semiconductor devices Q1 and Q4, as the power semiconductor module 20A that is applicable to the IPM 10 according to the first embodiment, is illustrated in FIG. 10B.

As illustrated in FIG. 10B, the 2-in-1 module 120B includes two IGBTs Q1 and Q4 and the diodes DI1 and DI4 inverse-parallel connected to the IGBTs Q1 and Q4 as one module. In FIG. 10B, G1 is a gate signal terminal electrode of the IGBT Q1, and E1 is an emitter terminal electrode of the IGBT Q1. Similarly, G4 is a gate signal terminal electrode of the IGBT Q4, and E4 is an emitter terminal electrode of the IGBT Q4. Further, P is a positive side power input terminal, N is a negative side power input terminal, and O is an output terminal electrode.

The semiconductor devices Q2 and Q5 applied to the power semiconductor module 20B that is applicable to the IPM 10 according to the first embodiment and the semiconductor devices Q3 and Q6 applied to the power semiconductor module 20C are the same, and thus, a detailed description thereof will be omitted.

(Device Structure)

Figure 11A:
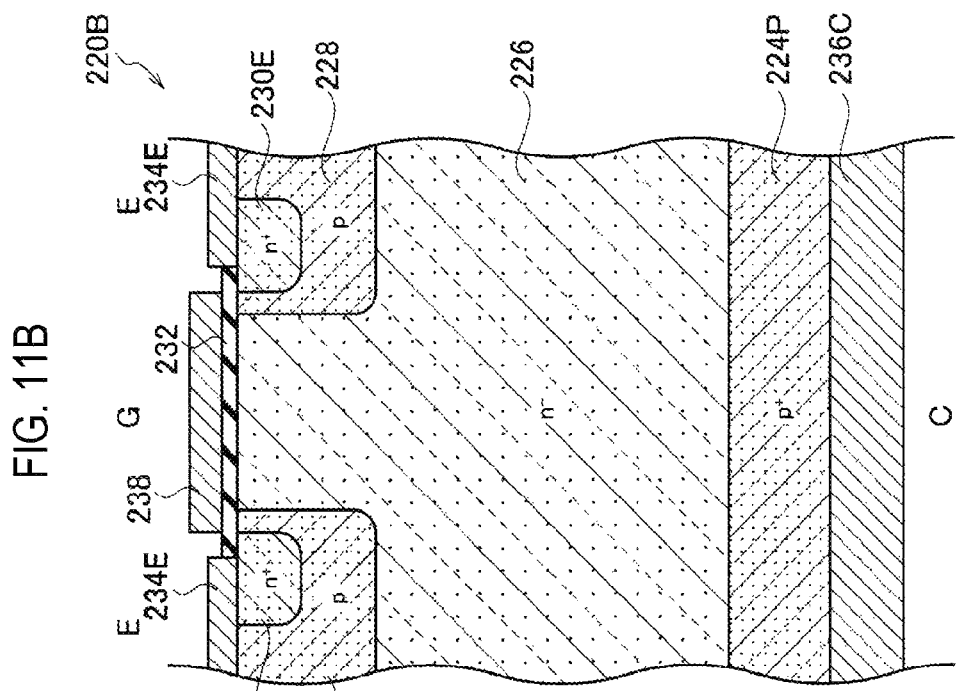
Figure 11B:
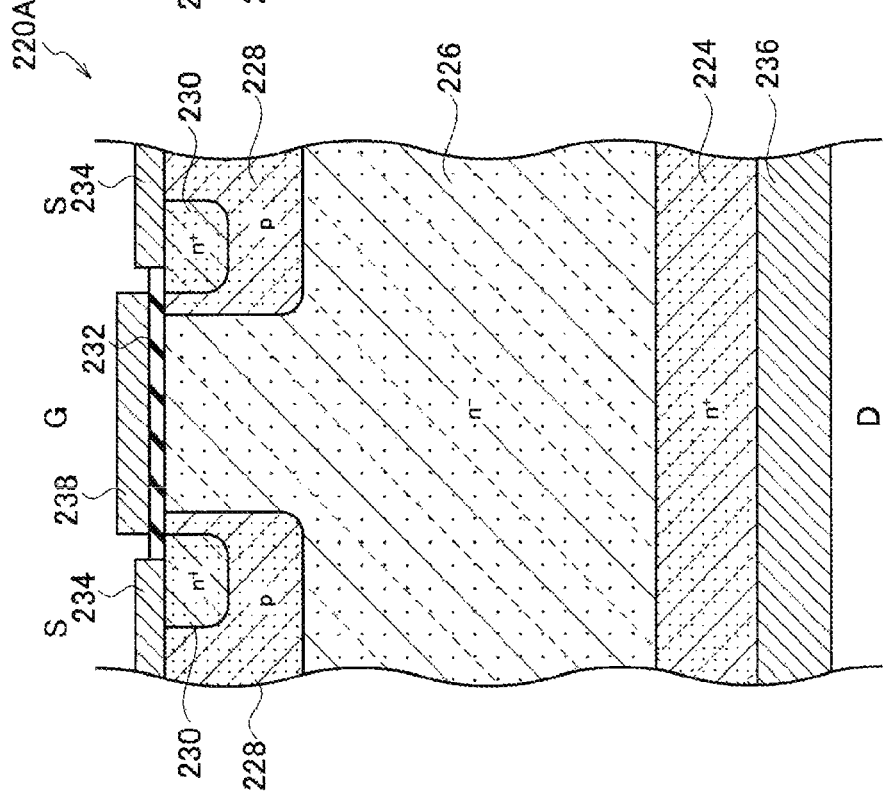

As a device structure of the power semiconductor module 20A that is applicable to the IPM 10 according to the first embodiment schematic cross-sectional structure of an SiC MOSFET 220A applied as semiconductor devices Q1 and Q4 is illustrated in FIG. 11A, and a schematic cross-sectional structure of an IGBT 220B is illustrated in FIG. 11B.

As illustrated in FIG. 11A, the SiC MOSFET 220A includes a semiconductor substrate 226 formed of an n– highly resistive layer, a p body region 228 formed on a surface side of the semiconductor substrate 226, a source region 230 formed on a surface of the p body region 228, a gate insulating film 232 disposed on a surface of the semiconductor substrate 226 between the p body regions 228, a gate electrode 238 disposed on the gate insulating film 232, a source electrode 234 connected to the source region 230 and the p body region 228, an n+ drain region 224 disposed on a rear surface opposing the surface of the semiconductor substrate 226, and a drain electrode 236 connected to the n+ drain region 224.

Figure 15:
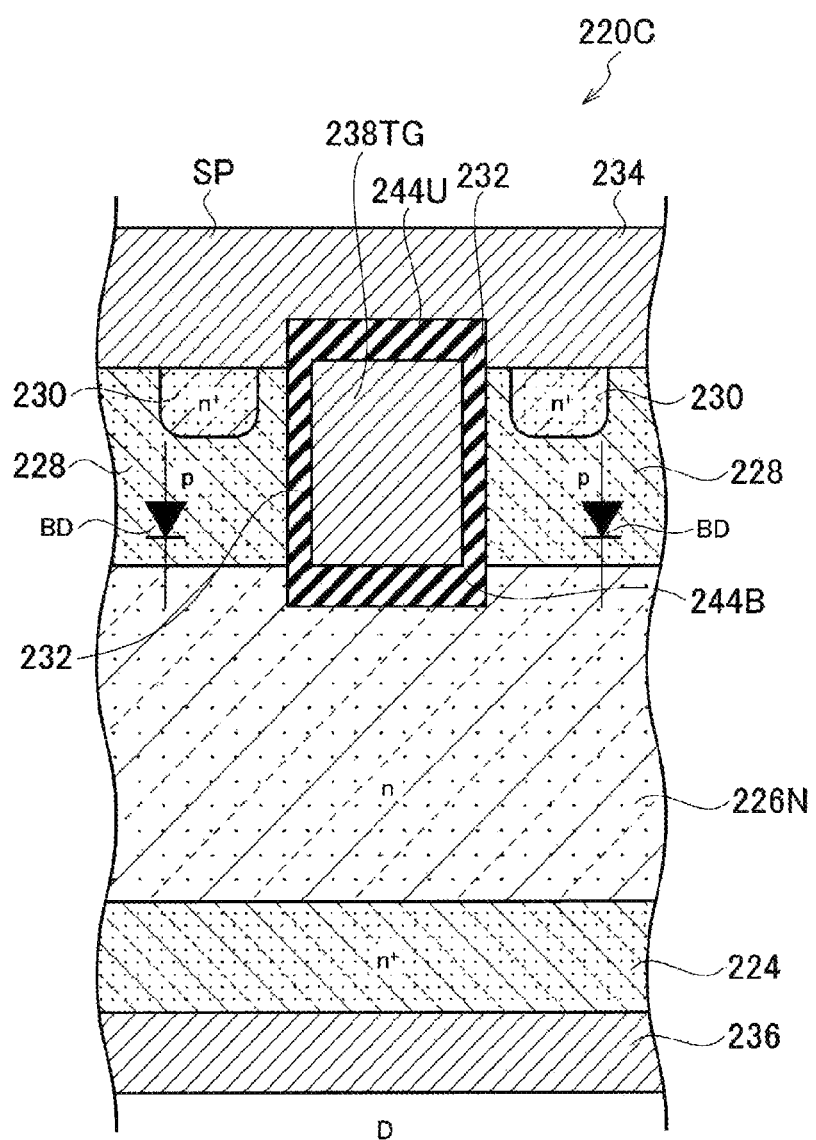
FIG. 15 is a view illustrating an example of the power semiconductor module that is applicable to the intelligent power module according to the first embodiment, which is specifically a schematic cross-sectional view of an SiC T MOSFET.

In FIG. 11A, the SiC MOSFET 220A is configured as a planar gate type n channel vertical SiC MOSFET, but it may also be configured as an n channel vertical SiC trench (T) MOSFET 220C or the like, as illustrated in FIG. 15 described later.

Alternatively, as the semiconductor devices Q1 and Q4 applied to the power semiconductor module 20A that is applicable to the IPM 10 according to the first embodiment, a GaN-based FET or the like may be employed, instead of the SiC MOSFET 220A.

The semiconductor devices Q2 and Q5 applied to the power semiconductor module 20B that is applicable to the IPM 10 according to the first embodiment and the semiconductor devices Q3 and Q6 applied to the power semiconductor module 20C are the same.

Further, in the semiconductor devices Q1 to Q6 applied to the power semiconductor module 20 that is applicable to the IPM 10 according to the first embodiment, a semiconductor having a band gap energy of, for example, 1.1 eV to 8 eV may be used.

Similarly, as illustrated in FIG. 11B, as the power semiconductor module 20A that is applicable to the IPM 10 according to the first embodiment, the IGBT 220B applied as the semiconductor devices Q1 and Q4 includes a semiconductor substrate 226 formed of an n-highly resistive layer, a p body region 228 formed on a surface side of the semiconductor substrate 226, an emitter region 230E formed on a surface of the p body region 228, a gate insulating film 232 disposed on a surface of the semiconductor substrate 226 between the p body regions 228, a gate electrode 238 disposed on the gate insulating film 232, an emitter electrode 234E connected to the emitter region 230E and the p body region 228, a p+ collector region 224P disposed on a rear surface opposing the surface of the semiconductor substrate 226, and a collector electrode 236C connected to the p+ collector region 224P.

In FIG. 11B, the IGBT 220B is configured as a planar gate type n channel vertical IGBT, but it may also be configured as a trench gate type n channel vertical IGBT or the like.

As an example of the semiconductor devices Q1 and Q4 applied to the power semiconductor module 20A that is applicable to the IPM 10 according to the first embodiment, a schematic cross-sectional structure of the SiC MOSFET 220A including the source pad electrode SP and the gate pad electrode GP is illustrated in FIG. 12.

The gate pad electrode GP is connected to the gate electrode 238 disposed on the gate insulating film 232, and the source pad electrode SP is connected to the source electrode 234 connected to the source region 230 and the p body region 228. Further, the gate pad electrode GP and the source pad electrode SP are disposed on an interlayer insulating film 244 for passivation that covers the surface of the SiC MOSFET 220A, as illustrated in FIG. 12.

Further, although not shown, a transistor structure having a fine structure may be formed within the semiconductor substrate 226 below the gate pad electrode GP and the source pad electrode SP, like the central portion of FIG. 11A.

Further, as illustrated in FIG. 12, the source pad electrode SP may extend on the interlayer insulating film 244 for passivation also in the transistor structure at the central portion.

Figure 13:
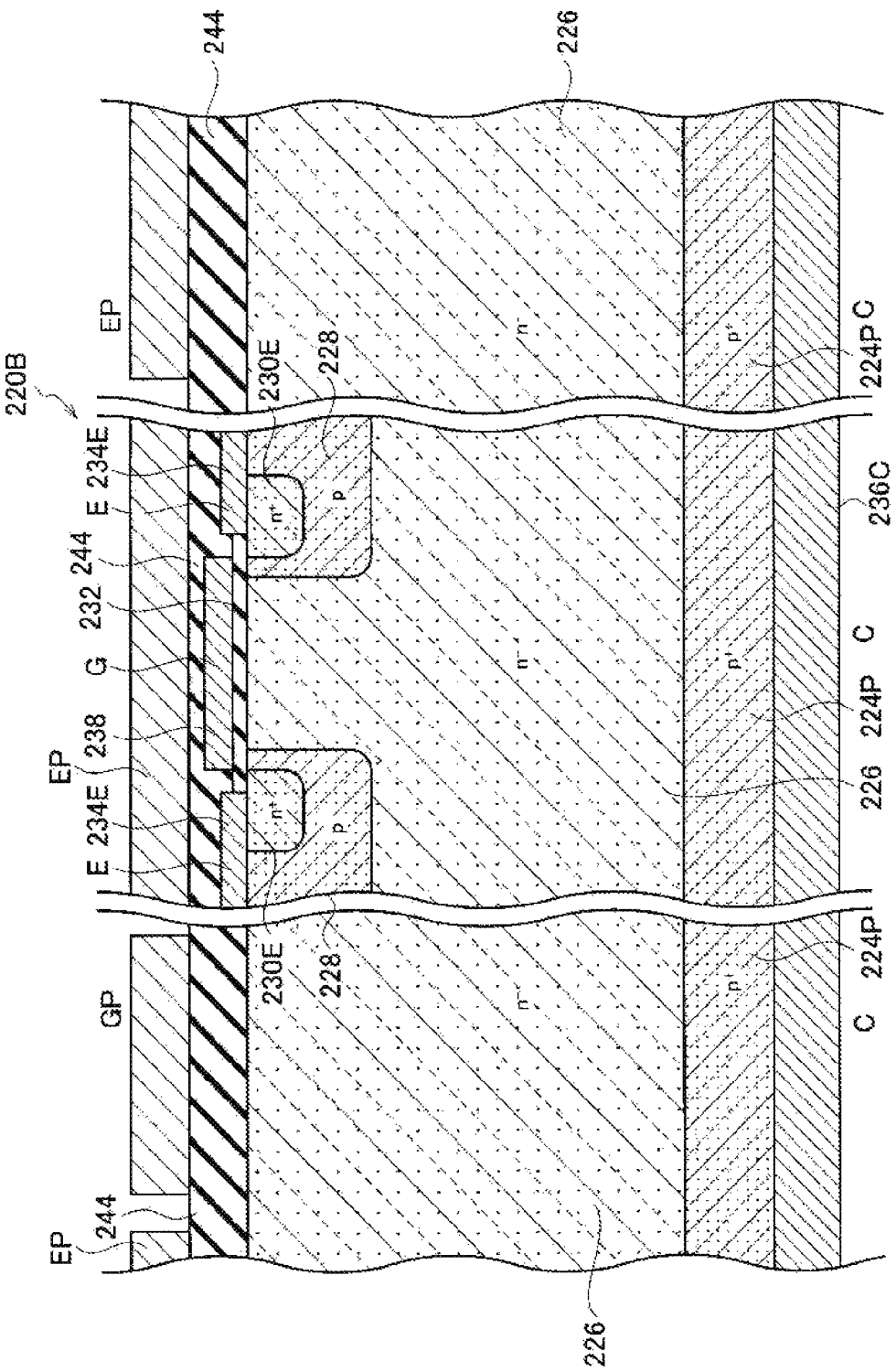
FIG. 13 is a view illustrating an example of the power semiconductor module that is applicable to the intelligent power module according to the first embodiment, which is specifically a schematic cross-sectional view of an IGBT including an emitter pad electrode EP and a gate pad electrode GP.

As an example of the semiconductor devices Q1 and Q4 applied to the power semiconductor module 20A that is applicable to the IPM 10 according to the first embodiment, a schematic cross-sectional structure of the IGBT 220B including the emitter pad electrode EP and the gate pad electrode GP is illustrated in FIG. 13.

The gate pad electrode GP is connected to the gate electrode 238 disposed on the gate insulating film 232, and the emitter pad electrode EP is connected to the emitter electrode 234E which is connected to the emitter region 230E and the p body region 228. Further, the gate pad electrode GP and the emitter pad electrode EP are disposed on an interlayer insulating film 244 for passivation that covers the surface of the IGBT 220B, as illustrated in FIG. 13.

Further, although not shown, an IGBT structure having a fine structure may be formed within the semiconductor substrate 226 below the gate pad electrode GP and the emitter pad electrode EP, like the central portion of FIG. 11B.

Further, as illustrated in FIG. 13, the emitter pad electrode EP may extend on the interlayer insulating film 244 for passivation also in the IGBT structure at the central portion.

The semiconductor devices Q2 and Q5 applied to the power semiconductor module 20B and the semiconductor devices Q3 and Q6 applied to the power semiconductor module 20C, which are applicable to the IPM 10 according to the first embodiment, are the same.

As the semiconductor devices Q1 to Q6, an SiC-based power device such as an SiC double implanted (DI) MOSFET or an SiC T MOSFET, or a GaN-based power device such as a GaN-based high electron mobility transistor (HEMT) may be employed or selected. Further, a power device such as an Si-based MOSFET or an IGBT is also applicable according to circumstances.

—SiC DI MOSFET—

Figure 14:
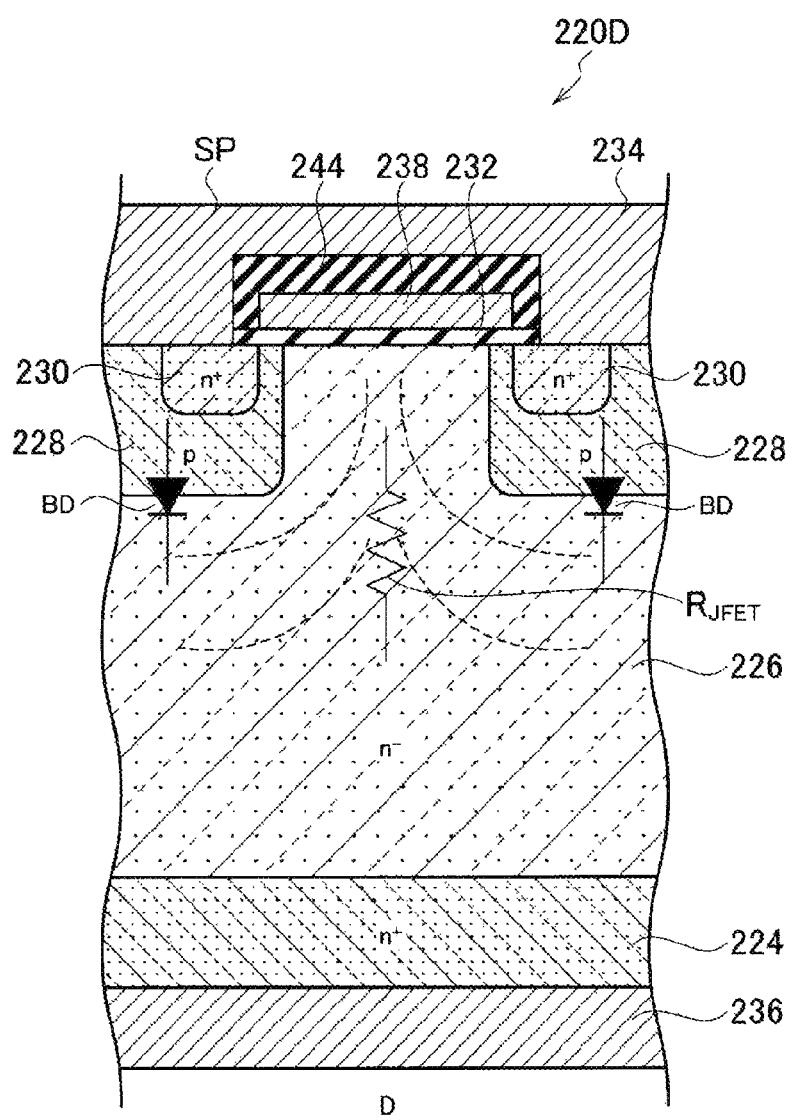
FIG. 14 is a view illustrating an example of the power semiconductor module that is applicable to the intelligent power module according to the first embodiment, which is specifically a schematic cross-sectional view of an SiC DI MOSFET.

As an example of a semiconductor device applied to the power semiconductor module 20 that is applicable to the IPM 10 according to the first embodiment, a schematic cross-sectional structure of an SiC DI MOSFET 220D is illustrated in FIG. 14.

As illustrated in FIG. 14, the SiC DI MOSFET 220D applied to the power semiconductor module 20 that is applicable to the IPM 10 according to the first embodiment includes a semiconductor substrate 226 formed of an n– highly resistive layer, a p body region 228 formed on a surface side of the semiconductor substrate 226, an n+ source region 230 formed on a surface of the p body region 228, a gate insulating film 232 disposed on a surface of the semiconductor substrate 226 between the p body regions 228, a gate electrode 238 disposed on the gate insulating film 232, a source electrode 234 connected to the source region 230 and the p body region 228, an n+ drain region 224 disposed on a rear surface opposing the surface of the semiconductor substrate 226, and a drain electrode 236 connected to the n+ drain region 224.

In FIG. 14, in the SiC DI MOSFET 220D, the p body region 228 and the n+ source region 230 formed on the surface of the p body region 228 are formed through dual ion implantation (DI), and the source pad electrode SP is connected to the source electrode 234 connected to the source region 230 and the p body region 228.

Although not shown, the gate pad electrode GP is connected to the gate electrode 238 disposed on the gate insulating film 232. Further, as illustrated in FIG. 14, the source pad electrode SP and the gate pad electrode GP are disposed on an interlayer insulating film 244 for passivation to cover the surface of the SiC DI MOSFET 220D.

As illustrated in FIG. 14, in the SiC DI MOSFET 220D, since a depletion layer indicated by the broken lines is formed within the semiconductor substrate 226 formed of an n– highly resistive layer between the p body regions 228, channel resistance $R_{JFET}$ based on an effect of an junction type FET (JFET) is formed. Further, as illustrated in FIG. 14, a body diode BD is formed between the p body region 228 and the semiconductor substrate 226.

—SiC T MOSFET—

As an example of a semiconductor device applied to the power semiconductor module 20 that is applicable to the IPM 10 according to the first embodiment, a schematic cross-sectional structure of an SiC T MOSFET is illustrated in FIG. 15.

As illustrated in FIG. 15, the SiC T MOSFET 220C applied to the power semiconductor module 20 that is applicable to the IPM 10 according to the first embodiment includes a semiconductor substrate 226n formed of an n layer, a p body region 228 formed on a surface side of the semiconductor substrate 226N, an n+ source region 230 formed on a surface of the p body region 228, a trench gate electrode 238TG formed, within a trench formed up to the semiconductor substrate 226N through the p body region 228, through a gate insulating film 232 and interlayer insulating films 244U and 244B, a source electrode 234 connected to the source region 230 and the p body region 228, an n+ drain region 224 disposed on a rear surface opposing the surface of the semiconductor substrate 226N, and a drain electrode 236 connected to the n+ drain region 224.

In FIG. 15, in the SiC T MOSFET 220C, the trench gate electrode 238TG is formed, within a trench formed up to the semiconductor substrate 226N through the p body region 228, through the gate insulating film 232 and the interlayer insulating films 244U and 244B, and the source pad electrode SP is connected to the source electrode 234 which are connected to the source region 230 and the p body region 228.

Although not shown, the gate pad electrode GP is connected to the trench gate electrode 238TG disposed on the gate insulating film 232. Further, as illustrated in FIG. 15, the source pad electrode SP and the gate pad electrode GP are disposed on the interlayer insulating film 244U for passivation to cover the surface of the SiC T MOSFET 220C.

In the SiC T MOSFET 220C, channel resistance $R_{JFET}$ based on the same effect of a junction type FET (JFET) as that of the SiC DI MOSFET 220D is not formed. Further, a body diode BD is formed between the p body region 228 and the semiconductor substrate 226N, as illustrated in FIG. 14.

(Applications)

Figure 16A:
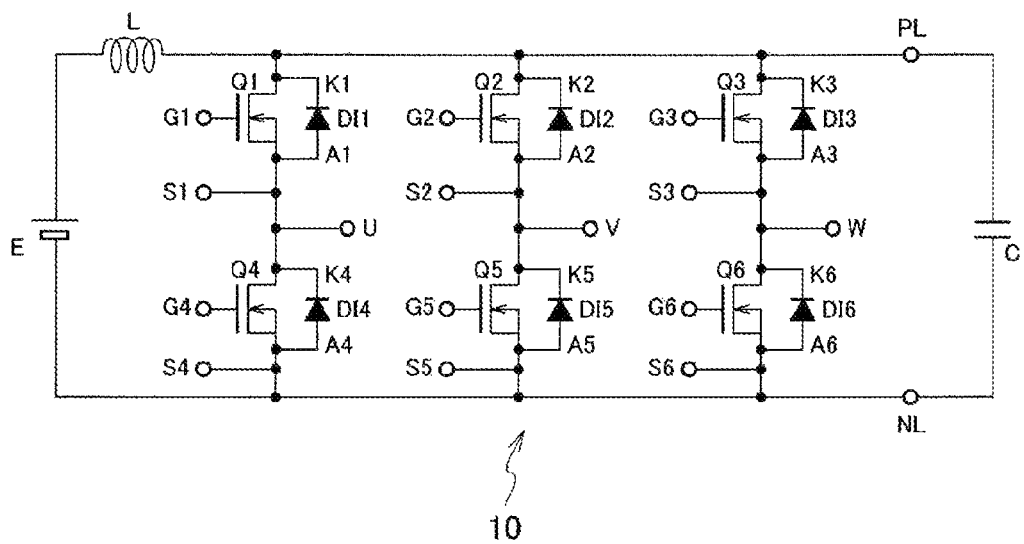

An example of a circuit configuration, which is a 3-phase AC inverter 300A formed using the IPM 10 according to the first embodiment and in which a snubber condenser C is connected between a power terminal PL and a ground terminal NL by employing an SiC MOSFET as a semiconductor device, is illustrated in FIG. 16A.

Figure 16B:
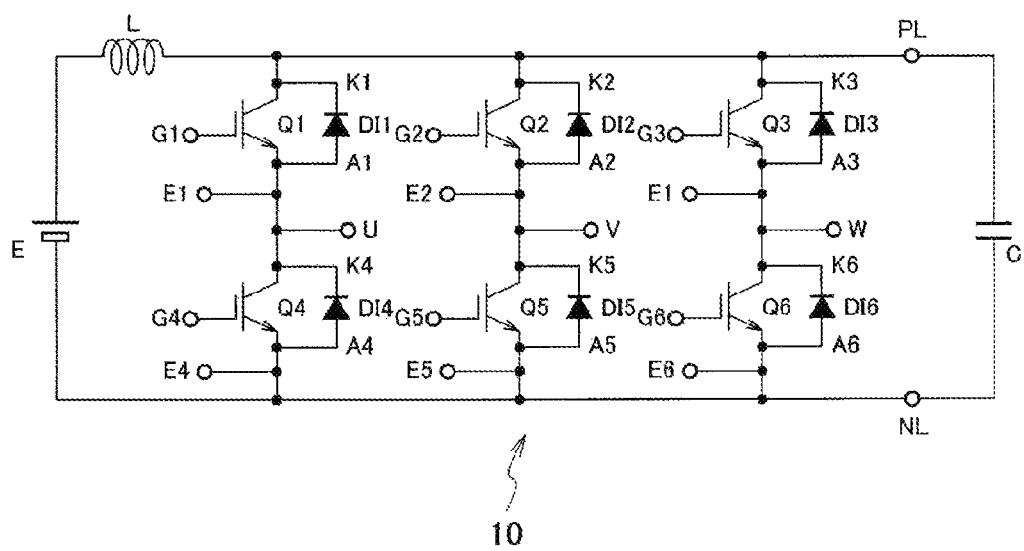

Similarly, an example of a circuit configuration, which is a 3-phase AC inverter 300B formed using the IPM 10 according to the first embodiment and in which a snubber condenser C is connected between a power terminal PL and a ground terminal NL by employing an IGBT as a semiconductor device, is illustrated in FIG. 16B.

When the IPM 10 according to the first embodiment is connected to a power source E, a switching rate of the SiC MOSFET or the IGBT is high due to inductance L of a connection line, generating a high surge voltage Ldi/dt. For example, when a change in current is di=300 A and a change in time according to switching is dt=100 nsec, di/dt=$3\times10^9$ (A/s).

Although the value of the surge voltage Ldi/dt is changed due to the inductance value L, the surge voltage Ldi/dt overlaps the power source E. The surge voltage Ldi/dt may be absorbed by the snubber condenser C connected between the power terminal PL and the ground terminal NL.

Specific Examples

Next, a 3-phase AC inverter 400A formed using the IPM 10 according to the first embodiment by employing an SiC MOSFET as a semiconductor device will be described with reference to FIG. 17.

Figure 17:
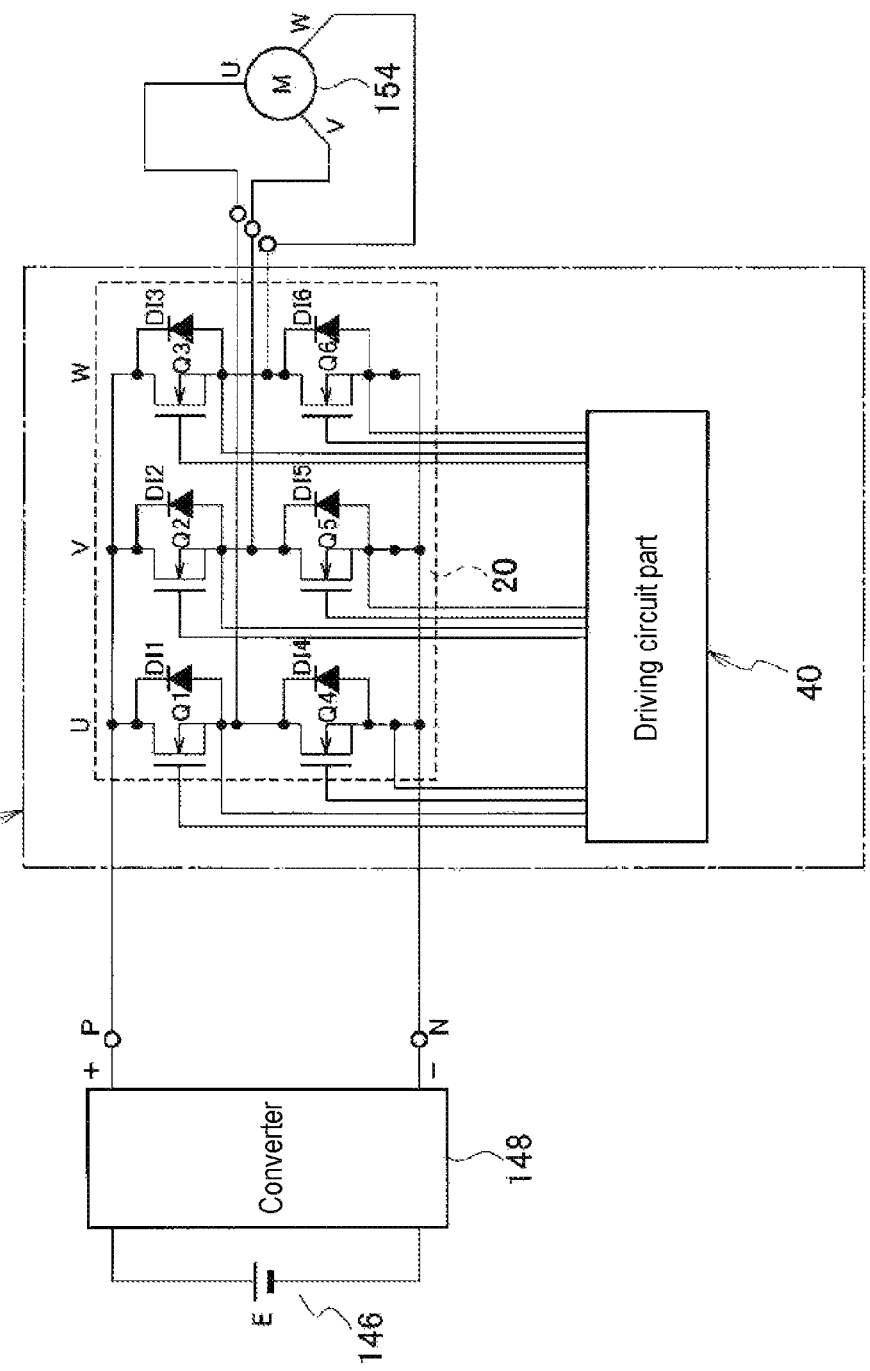
FIG. 17 is a view illustrating an example of a circuit configuration of the 3-phase AC inverter formed using the intelligent power module according to the first embodiment, which is specifically a circuit configuration of the 3-phase AC inverter employing an SiC MOSFET.

As illustrated in FIG. 17, the 3-phase AC inverter 400A includes the IPM 10 having the driving circuit part 40, a 3-phase AC motor part 154, a power source or a storage battery (E) 146, and a converter 148. In the IPM 10, a U-phase inverter, a V-phase inverter, and a W-phase inverter corresponding to a U phase, a V phase, and a W phase of the 3-phase AC motor unit 154 are connected thereto.

Here, the driving circuit part 40 is connected to SiC MOSFETs Q1 and Q4, SiC MOSFETs Q2 and Q5, and SiC MOSFETs Q3 and Q6.

The IPM 10 is connected between a positive terminal (+) P and a negative terminal (−) N of the converter 148 to which the power source or the storage battery (E) 146 is connected, and includes the SiC MOSFETs Q1•Q4, Q2•Q5, and Q3•Q6 having an inverter configuration. Further, free wheel diodes DI1 to DI6 are inverse-parallel connected between the sources and drains of the SiC MOSFETs Q1 to Q6, respectively.

Next, a 3-phase AC inverter 400B formed using the IPM 10 according to the first embodiment by employing an IGBT as a semiconductor device will be described with reference to FIG. 18.

Figure 18:
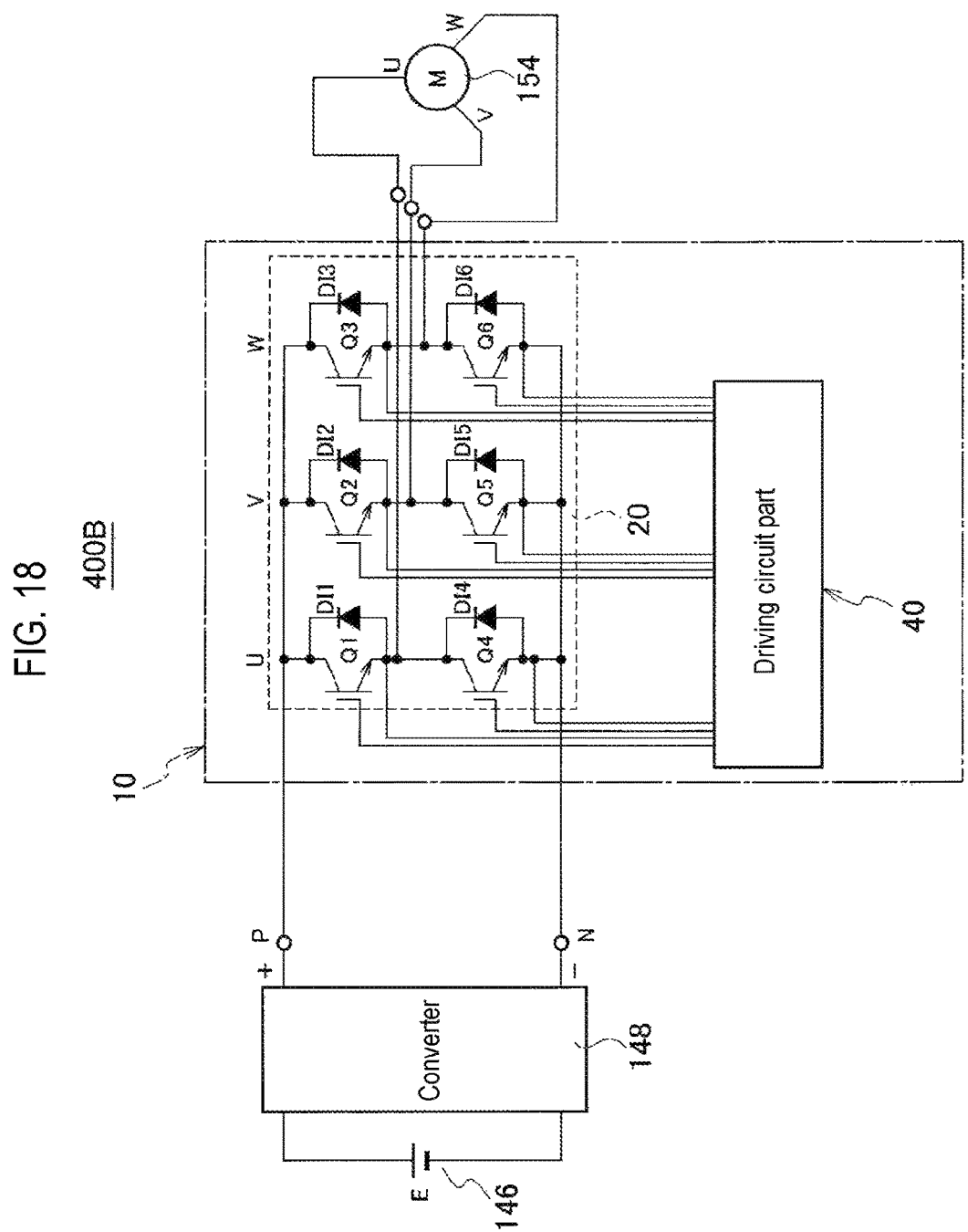
FIG. 18 is a view illustrating an example of a circuit configuration of the 3-phase AC inverter circuit formed using the intelligent power module according to the first embodiment, which is specifically a circuit configuration of the 3-phase AC inverter employing an IGBT.

As illustrated in FIG. 18, the 3-phase AC inverter 400B includes the IPM 10 having the driving circuit part 40, a 3-phase AC motor part 154, a power source or a storage battery (E) 146, and a converter 148. In the IPM 10, a U-phase inverter, a V-phase inverter, and a W-phase inverter corresponding to a U phase, a V phase, and a W phase of the 3-phase AC motor unit 154 are connected thereto.

Here, the driving circuit part 40 is connected to IGBTs Q1 and Q4, IGBTs Q2 and Q5, and IGBTs Q3 and Q6.

The IPM 10 is connected between a positive terminal (+) P and a negative terminal (−) N of the converter 148 to which the storage battery (E) 146 is connected, and includes the IGBTs Q1·Q4, Q2·Q5, and Q3·Q6 having an inverter configuration. Further, free wheel diodes DI1 to DI6 are inverse-parallel connected between the emitters and collectors of the IGBTs Q1 to Q6, respectively.

Second Embodiment (Schematic Configuration)

Figure 19:
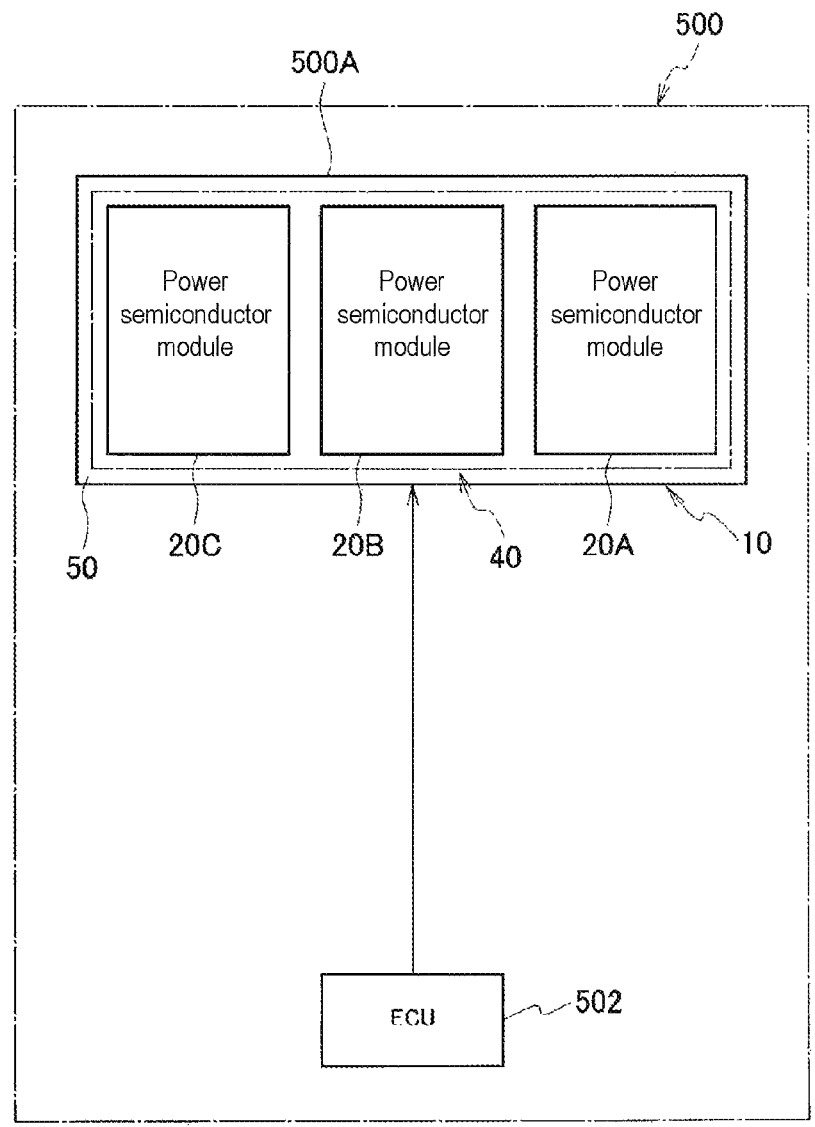
FIG. 19 is a schematic block diagram illustrating an example of a case where an intelligent power module according to a second embodiment is applied to a power control unit of an electric vehicle or a hybrid car.

In the IPM 10 that is mountable on a power control unit 500 of an electric vehicle or a hybrid car according to a second embodiment, a circuit block diagram of the power control unit 500 is illustrated in FIG. 19.

As illustrated in FIG. 19, the IPM 10 that is mountable on the power control unit 500 of an electric vehicle or a hybrid car is configured as a 3-phase AC inverter 500A for supplying a 3-phase driving current to, for example, a motor (not shown) as an engine for a vehicle.

The 3-phase AC inverter 500A is controlled by an ECU 502 for controlling driving of a motor and the like, in the power control unit 500 of an electric vehicle or a hybrid car.

As described above, according to the present embodiment, it is possible to make the IPM 10 have excellent heat dissipation properties, be easily modularized, and be suitably miniaturized. In particular, since the plurality of power semiconductor modules 20A, 20B, and 20C can be effectively cooled, it is possible to provide the IPM 10 that can suppress degradation due to overheating, and an electric vehicle or a hybrid car having the IPM 10 mounted thereon.

As the IPM that is mountable on the power control unit 500 of an electric vehicle or a hybrid car according to the second embodiment, at least one power semiconductor module 20 may be mounted.

Further, in this embodiment, a semiconductor package device that is applicable to the power semiconductor module is not limited to the semiconductor package device having a 3-terminal structure having the terminal electrodes P, N, and O, each by one, and may be a semiconductor package device having a 4-terminal structure.

In addition, as a semiconductor device that is applicable to a power semiconductor module of the IPM according to the present embodiment is not limited to the SiC-based power device and may be a GaN-based or Si-based power device.

Moreover, the present disclosure is not limited to an inverter but is also applicable to a converter.

Other Embodiments

As mentioned above, although some embodiments have been described, the description and drawings constituting part of the present disclosure are merely illustrative and should not be understood to be limiting. Various alternative embodiments, examples, and operating techniques will be apparent to those skilled in the art from the present disclosure.

Thus, the present disclose includes a variety of embodiments and the like that are not disclosed herein.

The IPM of the present embodiment can be utilized in techniques of manufacturing various semiconductor modules such as IGBT modules, diode modules, and MOS modules (Si, SiC, and GaN) and can be applicable to wide applications such as inverters for a hybrid electric vehicle (HEV)/electric car (EV), industrial inverters, and converters.

According to some embodiments of the present disclosure in, it is possible to provide an intelligent power module, and an electric vehicle or a hybrid car, having excellent heat dissipation properties, being easily modularized, and being suitably miniaturized.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An intelligent power module, comprising:
at least one power semiconductor module including a semiconductor device, and a sealing body sealing an outer periphery of the semiconductor device;
a driving circuit part mounted on the sealing body and configured to drive the power semiconductor module;
a cooling part on which the sealing body is mounted, and configured to cool the power semiconductor module; and
a heat dissipation plate installed between the power semiconductor module and the driving circuit part,
wherein a plate mounting hole is formed in the cooling part to fix the heat dissipation plate to a surface of the cooling part, the sealing body being mounted on the surface of the cooling part,
the cooling part is configured to cool the power semiconductor module and the driving circuit part through the heat dissipation plate,
the at least one power semiconductor module includes a plurality of power semiconductor modules,
the driving circuit part is commonly installed with respect to the plurality of the power semiconductor modules,
the driving circuit part has a rectangular shape, and comprises a primary side circuit part disposed in a length direction and a secondary side circuit part disposed to be adjacent to the primary side circuit part, and
the primary side circuit part comprises a power source circuit, a short-circuit protection circuit, a temperature monitoring circuit, and a voltage drop detection circuit.

2. The intelligent power module of claim 1, wherein the sealing body is a package formed of a mold resin, and
wherein a circuit part mounting hole is formed in the sealing body to fix the driving circuit part to a surface of the sealing body, the driving circuit part being mounted on the surface of the sealing body.

3. The intelligent power module of claim 1, wherein the cooling part comprises a positioning convex portion serving as a reference when the power semiconductor module is mounted on a surface of the cooling part, the sealing body being mounted on the surface of the cooling part.

4. The intelligent power module of claim 3, wherein the positioning convex portion is formed to have a frame shape.

5. The intelligent power module of claim 4, wherein the sealing body is bonded through a bonding paste or a solder within the positioning convex portion having the frame shape.

6. The intelligent power module of claim 1, wherein the heat dissipation plate is bonded to the driving circuit part through a heat dissipation sheet made of a resin material or a heat dissipation resin.

7. The intelligent power module of claim 1, wherein the heat dissipation plate is bonded to the power semiconductor module through a heat dissipation resin.

8. The intelligent power module of claim 1, wherein the cooling part is commonly installed with respect to the plurality of the power semiconductor modules.

9. The intelligent power module of claim 1, wherein the secondary side circuit part comprises a gate driver.

10. The intelligent power module of claim 9, wherein the gate driver comprises a plurality of high voltage side drive circuits and a plurality of low voltage side drive circuits.

11. The intelligent power module of claim 10, wherein, in the gate driver, the plurality of high voltage side drive circuits and the plurality of low voltage side drive circuits are alternately disposed.

12. The intelligent power module of claim 10, wherein the plurality of high voltage side drive circuits and the plurality of low voltage side drive circuits are commonly connected to the power source circuit via each transformer disposed across the primary side circuit part and the secondary side circuit part.

13. The intelligent power module of claim 10, wherein the plurality of high voltage side drive circuits and the plurality of low voltage side drive circuits are commonly connected to the short-circuit protection circuit, the temperature monitoring circuit, and the voltage drop detection circuit via each insulating coupler disposed across the primary side circuit part and the secondary side circuit part.

14. The intelligent power module of claim 1, wherein the semiconductor device is selected from a group consisting of an IGBT, a diode, an Si-based MOSFET, an SiC-based MOSFET, and a GaN-based FET.

15. The intelligent power module of claim 14, wherein the power semiconductor module constitutes a switching module.

16. An electric vehicle having the intelligent power module of claim 1 mounted thereon.

17. A hybrid car having the intelligent power module of claim 1 mounted thereon.

* * * * *